(12) United States Patent
Seo et al.

(10) Patent No.: US 12,477,791 B2
(45) Date of Patent: Nov. 18, 2025

(54) SEMICONDUCTOR DEVICE HAVING HYBRID CHANNEL STRUCTURE

(71) Applicant: SAMSUNG ELECTRONICS CO., LTD., Suwon-si (KR)

(72) Inventors: Kang-ill Seo, Albany, NY (US); Sooyoung Park, Clifton Park, NY (US); Byounghak Hong, Albany, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 708 days.

(21) Appl. No.: 17/576,726

(22) Filed: Jan. 14, 2022

(65) Prior Publication Data

US 2023/0154983 A1    May 18, 2023

Related U.S. Application Data

(60) Provisional application No. 63/280,380, filed on Nov. 17, 2021.

(51) Int. Cl.
*H10D 30/67* (2025.01)
*H10D 30/01* (2025.01)
(Continued)

(52) U.S. Cl.
CPC ......... *H10D 62/118* (2025.01); *H10D 30/031* (2025.01); *H10D 30/6713* (2025.01);
(Continued)

(58) Field of Classification Search
CPC ........... H01L 29/0673; H01L 29/42392; H01L 29/66787; H01L 29/78696;
(Continued)

(56) References Cited

U.S. PATENT DOCUMENTS

| 10,366,931 B2 | 7/2019 | Xie et al. |
| 10,381,462 B2 | 8/2019 | Seo |

(Continued)

FOREIGN PATENT DOCUMENTS

| CN | 111106111 A | 5/2020 |
| CN | 111554747 A | 8/2020 |
| CN | 111106176 B | 9/2021 |

OTHER PUBLICATIONS

Communication issued Mar. 31, 2023 by the European patent Office in counterpart European Patent Application No. 22207705.9.

*Primary Examiner* — Matthew C Landau
*Assistant Examiner* — Nora T. Nix
(74) *Attorney, Agent, or Firm* — Sughrue Mion, PLLC (57) ABSTRACT

A semiconductor device includes: a substrate; at least one hybrid channel structure formed on the substrate and including at least one $1^{st}$ channel structure extended in $1^{st}$ and $2^{nd}$ directions in parallel with an upper surface of the substrate without directly contacting the substrate, and a $2^{nd}$ channel structure connected to and intersecting the at least one $1^{st}$ channel structure in a $3^{rd}$ direction perpendicular to the $1^{st}$ or $2^{nd}$ direction; a gate structure surrounding the hybrid channel structure; and source/drain regions respectively formed at two opposite ends of the at least one hybrid channel structure in the $1^{st}$ direction.

17 Claims, 9 Drawing Sheets

(51) Int. Cl.
  *H10D 62/10* (2025.01)
  *H10D 84/01* (2025.01)
  *H10D 84/03* (2025.01)

(52) U.S. Cl.
  CPC ..... *H10D 30/6757* (2025.01); *H10D 84/0128* (2025.01); *H10D 84/013* (2025.01); *H10D 84/038* (2025.01)

(58) Field of Classification Search
  CPC . H10D 30/501–509; H10D 30/43–435; H10D 62/119–123; H10D 30/014; Y10S 977/938
  See application file for complete search history.

(56) References Cited

U.S. PATENT DOCUMENTS

| | | |
|---|---|---|
| 10,784,171 B2 | 9/2020 | Frougier et al. |
| 10,957,761 B2 | 3/2021 | Yeh et al. |
| 11,049,934 B2 | 6/2021 | Razavieh et al. |
| 11,088,288 B2 | 8/2021 | Xie et al. |
| 11,101,359 B2 | 8/2021 | Wu et al. |
| 2020/0273979 A1 | 8/2020 | Xie et al. |
| 2020/0402984 A1* | 12/2020 | Reznicek ............. H10D 64/667 |
| 2021/0249530 A1 | 8/2021 | Yang et al. |
| 2021/0249531 A1* | 8/2021 | Liaw ................... H10D 64/514 |
| 2022/0093743 A1* | 3/2022 | Wang ................. H01L 29/7853 |
| 2022/0328628 A1* | 10/2022 | Zhu .................... H10D 84/0151 |
| 2022/0416023 A1* | 12/2022 | Zhu ................ H01L 21/823814 |
| 2023/0187560 A1* | 6/2023 | Zhu ................ H01L 21/823892 257/351 |

* cited by examiner

SEMICONDUCTOR DEVICE HAVING HYBRID CHANNEL STRUCTURE

CROSS-REFERENCE TO THE RELATED APPLICATION

This application is based on and claims priority from U.S. Provisional Application No. 63/280,380 filed on Nov. 17, 2021 in the U.S. Patent and Trademark Office, the disclosure of which is incorporated herein in its entirety by reference.

BACKGROUND

1. Field

Apparatuses and methods related to example embodiments of the inventive concept relate to a semiconductor device formed of one or more hybrid channel structures, and more particularly to, one or more transistors each including a hybrid channel structure, and a method of manufacturing the same.

2. Description of the Related Art

It is well known that a fin field-effect transistor (FinFET) having a fin structure of which three sides are surrounded by a gate structure provides much better control of current flow through a channel formed by the fin structure, compared to a planar transistor. However, the gate structure in the FinFET surrounds the silicon-based fin structure on only three sides, leaving the bottom side connected to a body of a silicon substrate, some leakage current still flows when the transistor is off, which leads to a hotter, less power-efficient semiconductor device including the FinFET.

Recently, a nanosheet transistor has been introduced over growing demand for improved performance and miniaturization of a semiconductor device. The nanosheet transistor is characterized by multiple nanosheet layers bridging source/drain regions formed at both ends thereof and a gate structure that wraps around all four sides of each nanosheet layer. These nanosheet layers function as a channel structure for current flow between the source/drain regions of the nanosheet transistor. Due to this structure, improved control of current flow through the multiple nanosheet layers and an increased effective channel width ($W_{eff}$) are enabled in addition to higher device density in a semiconductor device including the nanosheet transistor. The nanosheet transistor is also referred to with various different names such as multi-bridge channel FET (MBCFET), nanobeam, nanoribbon, superimposed channel device, etc.

However, the nanosheet transistor presents challenges in manufacturing thereof due to its complex structure compared to the FinFET which is still favored in the industry due to the mature manufacturing process. Further, the FinFET is known to provide at least an enhanced carrier mobility, particularly with respect to holes (p-type carrier), along the relatively large vertical surface of the vertically protruded fin structure.

Thus, the inventors of the present application have developed a novel inventive concept of a transistor having a hybrid channel structure which is a combination of nanosheet layers and a fin structure to achieve the advantages of the nanosheet transistor and the FinFET.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

The disclosure provides a semiconductor device including one or more hybrid channel structures forming one or more transistors on a substrate, and a method of manufacturing the same.

According to an embodiment, there is provided a semiconductor device which may include: a substrate; at least one hybrid channel structure formed on the substrate and including at least one $1^{st}$ channel structure extended in $1^{st}$ and $2^{nd}$ directions in parallel with an upper surface of the substrate without directly contacting the substrate, and a $2^{nd}$ channel structure connected to and intersecting the at least one $1^{st}$ channel structure in a $3^{rd}$ direction perpendicular to the $1^{st}$ or $2^{nd}$ direction; a gate structure surrounding the hybrid channel structure; and source/drain regions respectively formed at two opposite ends of the at least one hybrid channel structure in the $1^{st}$ direction.

The at least one $1^{st}$ channel structure may include a plurality of $1^{st}$ channel structures stacked in parallel with each other, and the $2^{nd}$ channel structure may connect at least two of the $1^{st}$ channel structures in the $3^{rd}$ direction at end portions thereof in the $2^{nd}$ direction.

According to an embodiment, there is provided a semiconductor device which may include: a substrate; a plurality of $1^{st}$ nanosheet layers formed above the substrate, and extended in $1^{st}$ and $2^{nd}$ directions perpendicular to each other; a $1^{st}$ fin structure formed above the substrate, extended in the $1^{st}$ direction, and connecting at least two of the $1^{st}$ nanosheet layers in a $3^{rd}$ direction perpendicular to the $1^{st}$ or $2^{nd}$ direction, a width of the $1^{st}$ fin structure being smaller than a width of each of the $1^{st}$ nanosheet layers in the $2^{nd}$ direction; a gate structure surrounding the $1^{st}$ nanosheet layers and the $1^{st}$ fin structure; and $1^{st}$ source/drain regions respectively formed at two opposite ends of each of the $1^{st}$ nanosheet layers in the $1^{st}$ direction, wherein two opposite ends of the $1^{st}$ fin structure in the $1^{st}$ direction are respectively connected to the $1^{st}$ source/drain regions.

The semiconductor device may further include: a plurality of $2^{nd}$ nanosheet layers formed above the $1^{st}$ nanosheet layers and the $1^{st}$ fin structure, and extended in the $1^{st}$ and $2^{nd}$ directions in parallel; a $2^{nd}$ fin structure formed above the $1^{st}$ nanosheet layers and the $1^{st}$ fin structure, extended in the $1^{st}$ direction, and connecting at least two of the $2^{nd}$ nanosheet layers in the $3^{rd}$ direction, a width of $2^{nd}$ fin structure being smaller than a width of each of the $2^{nd}$ nanosheet layers in the $2^{nd}$ direction; and $2^{nd}$ source/drain regions respectively formed at two opposite ends of each of the $2^{nd}$ nanosheet layers in the $1^{st}$ direction, wherein the $2^{nd}$ nanosheet layers and the $2^{nd}$ fin structure are surrounded by the gate structure, and two opposite ends of the $2^{nd}$ fin structure in the $1^{st}$ direction are respectively connected to the $2^{nd}$ source/drain regions.

The $1^{st}$ source/drain regions may be doped with n-type impurities, and the $2^{nd}$ source/drain regions may be doped with p-type impurities.

According to an embodiment, there is provided a method of manufacturing a semiconductor device. The method may include: providing a nanosheet stack including a plurality of sacrificial layers and nanosheet layers alternatingly stacked on a substrate; forming at least one opening exposing upward a lowermost nanosheet layer among the nanosheet layers; forming at least one fin structure, in the at least one opening, which connects the lowermost nanosheet layer and an uppermost nanosheet layer among the nanosheet layers; patterning at least one channel stack comprising a section of the sacrificial layers and the nanosheet layers in a channel width direction and the at least one fin structure; forming source/drain regions on two opposite ends of the at least one channel stack in a channel length direction; removing the section of the sacrificial layers from the at least one channel stack; and forming a gate structure on the at least one channel stack from which the section of the sacrificial layers is removed.

BRIEF DESCRIPTION OF THE DRAWINGS

Example embodiments of the inventive concept will be more clearly understood from the following detailed description taken in conjunction with the accompanying drawings in which.

DETAILED DESCRIPTION OF THE EMBODIMENTS

All of the embodiments described herein are example embodiments, and thus, the inventive concept is not limited thereto, and may be realized in various other forms. Each of the embodiments provided herein is not excluded from being associated with one or more features of another example or another embodiment also provided herein or not provided herein but consistent with the inventive concept. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the inventive concept are intended to encompass structural and functional equivalents thereof. In addition, these equivalents should be understood as including not only currently well-known equivalents but also equivalents to be developed in the future, that is, all devices invented to perform the same functions regardless of the structures thereof. For example, a FinFET, a nanosheet transistor, or a hybrid transistor which is a combination of a FinFET and a nanosheet transistor described herein may take a different type or form of a transistor as long as the inventive concept can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms $1^{st}$, $2^{nd}$, $3^{rd}$, $4^{th}$, etc. may be used herein to describe various elements, these elements should not be limited by these terms. These terms are only used to distinguish one element from another element. Thus, a first element discussed below could be termed a second element without departing from the teachings of the inventive concept.

It will be also understood that, even if a certain step or operation of manufacturing an inventive apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

For the sake of brevity, conventional elements to semiconductor devices including a nanosheet transistor and a FinFET may or may not be described in detail herein.

Herebelow, it is understood that the term "transistor" may refer to a semiconductor device including a gate structure and source/drain regions on a substrate, and the term "transistor structure" may refer to an intermediate semiconductor device structure before at least one of the gate structure and the source/drain regions is formed to complete the semiconductor device structure as a transistor. It is also understood that a D1 direction, a D2 direction, and a D3 direction shown in the drawings and described herein refer to a channel length direction, a channel width direction, and a channel height direction, respectively, in a corresponding semiconductor device including one or more transistor or transistor structures. Also, it is understood that the D1 direction and the D2 direction are two horizontal directions perpendicular to each other, and the D3 direction is a vertical direction perpendicular to each of the D1 direction and the D2 direction.

Figure 1A:
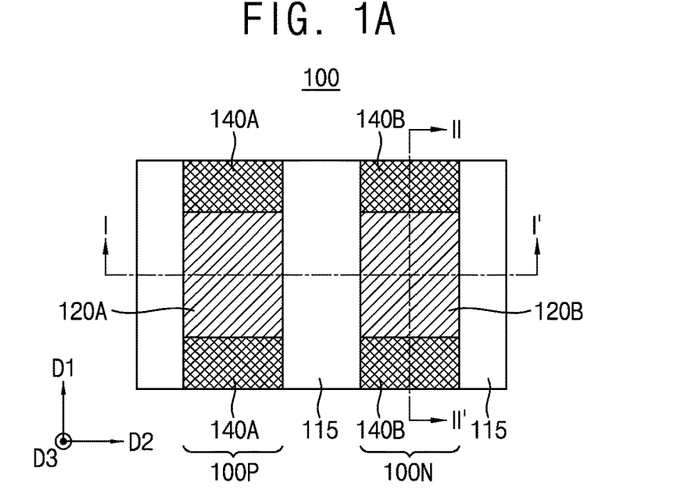
FIG. 1A illustrates a top plan view of a related-art semiconductor device formed of two nanosheet transistors.
Figure 1B:
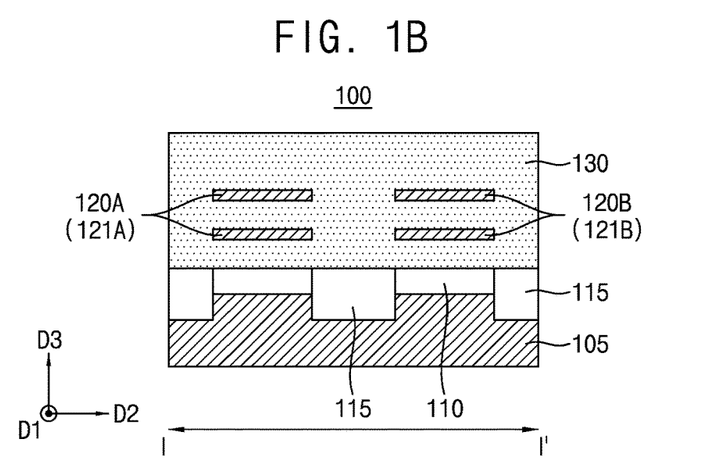
FIGS. 1B and 1C illustrate cross-sectional views of the semiconductor device of FIG. 1A taken along lines I-I' and II-II' shown in FIG. 1A, respectively.
Figure 1C:
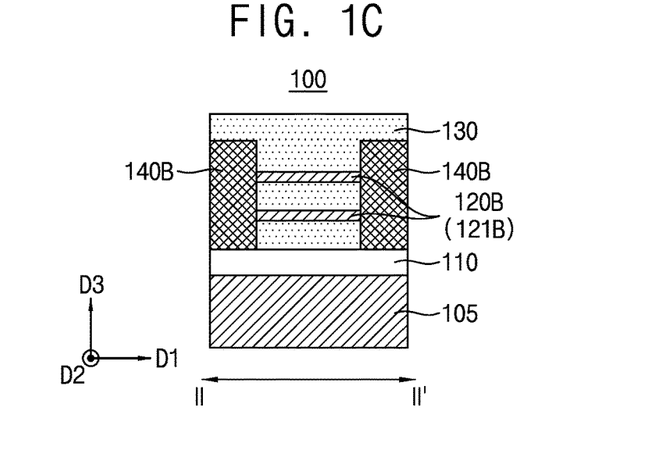

FIG. 1A illustrates a top plan view of a related-art semiconductor device formed of two nanosheet transistors, and FIGS. 1B and 1C illustrate cross-sectional views of the semiconductor device of FIG. 1A taken along lines I-I' and II-II' shown in FIG. 1A, respectively.

In FIGS. 1A-1C, a semiconductor device 100 according to the related art includes a p-type nanosheet field-effect transistor (PFET) 100P and an n-type nanosheet field-effect transistor (NFET) 100N to form a complementary metal-oxide-semiconductor (CMOS) transistor.

It is understood here that the top plan view of the semiconductor device 100 in FIG. 1A does not show a gate structure 130 (shown in FIGS. 1B and 1C) so that the other structures of the PFET 100P and the NFET 100N surrounded by the gate structure 130 can be better depicted. Thus, FIG. 1A shows that the PFET 100P includes a $1^{st}$ nanosheet channel structure 120A and $1^{st}$ source/drain regions 140A formed at two opposite ends of the $1^{st}$ nanosheet channel structure in the D1 direction, and the NFET 100N includes a $2^{nd}$ nanosheet channel structure 120B and $2^{nd}$ source/drain regions 140B formed at two opposite ends of the $2^{nd}$ nanosheet channel structure 120B in the D1 direction. The PFET 100P and the NFET 100N may be formed on a substrate 105 side by side to form a CMOS transistor with a shallow trench isolation (STI) structure 115 therebetween as shown in FIG. 1B.

As shown in FIGS. 1B and 1C, the $1^{st}$ nanosheet channel structure 120A is formed of a plurality of $1^{st}$ nanosheet layers 121A, and the $2^{nd}$ nanosheet channel structure 120B is formed of a plurality of $2^{nd}$ nanosheet layers 121B. The $1^{st}$ and $2^{nd}$ nanosheet layers 121A and 121B are surrounded by the gate structure 130 on the substrate 105. As noted above, the STI structures 115 are formed in the substrate 105 to isolate the PFET 100P and the NFET 100N from each other and from neighboring transistors, and an isolation layer 110 is formed between the substrate 105 and each of the $1^{st}$ and $2^{nd}$ nanosheet channel structures 120A and 120B to isolate the gate structure 230 surrounding the $1^{st}$ and $2^{nd}$ nanosheet channel structures 120A and 120B from the substrate 205.

According to FIG. 1B, the gate structure 130 surrounds all four sides of each of the rectangular-shaped $1^{st}$ and $2^{nd}$ nanosheet layers 121A and 121B. The gate structure 130 may provide a common gate of the PFET 100P and the NFET 100N of the semiconductor device 100 to form a CMOS.

As such, the semiconductor device 100 shown in FIGS. 1A-1C is formed of only the plurality of $1^{st}$ and $2^{nd}$ nanosheet layers 121A and 121B as the $1^{st}$ and $2^{nd}$ nanosheet channel structures 120A and 120B of the PFET 100P and the NFET 100N, respectively.

Figure 2A:
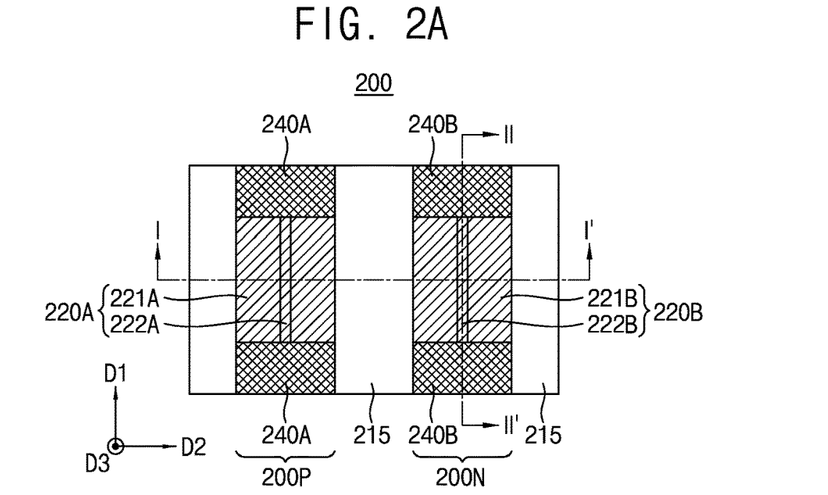
FIG. 2A illustrates a top plan view of a semiconductor device formed of two hybrid transistors.
Figure 2B:
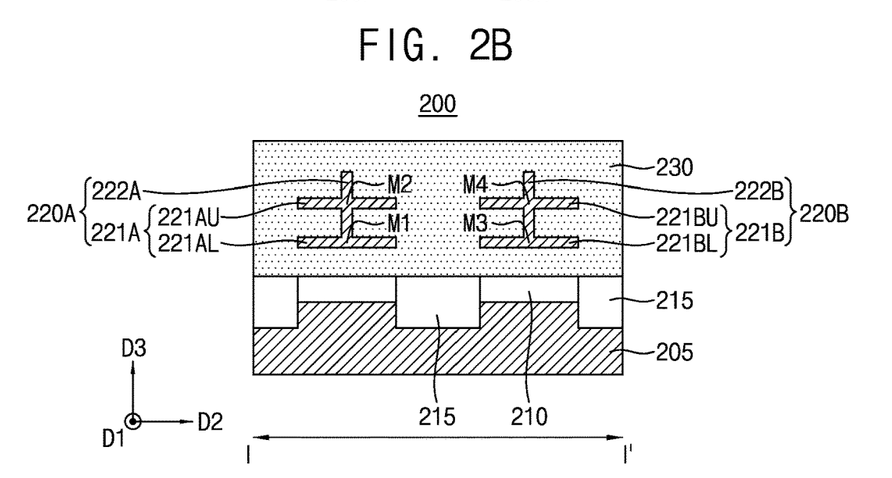
FIGS. 2B and 2C illustrate cross-sectional views of the semiconductor device of FIG. 2A taken along lines I-I' and II-II' shown in FIG. 2A, respectively, according to an embodiments.
Figure 2C:
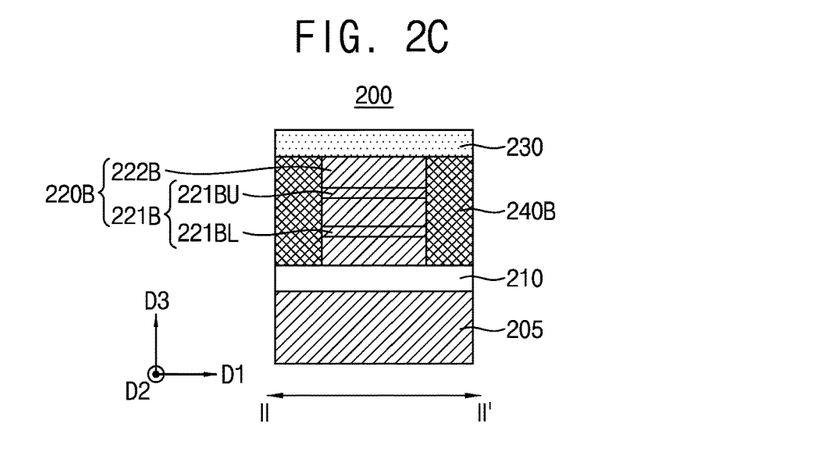

FIG. 2A illustrates a top plan view of a semiconductor device formed of two hybrid transistors, and FIGS. 2B and 2C illustrate cross-sectional views of the semiconductor device of FIG. 2A taken along lines I-I' and II-II' shown in FIG. 2A, respectively, according to an embodiments.

In FIGS. 2A-2C, a semiconductor device 200 according to the present embodiments includes a p-type hybrid field-effect transistor (PFET) 200P and an n-type hybrid field-effect transistor (NFET) 200N to form a CMOS transistor.

Similar to FIG. 1A, FIG. 2A shows the top plan view of the semiconductor device 200 without a gate structure 230 (FIGS. 2B and 2C) so that the other structures of the PFET 200P and the NFET 200N surrounded by the gate structure 230 can be better depicted. Thus, FIG. 2A shows that the PFET 200P includes a $1^{st}$ hybrid channel structure 220A and $1^{st}$ source/drain regions 240A formed at two opposite ends of the $1^{st}$ hybrid channel structure 220A in the D1 direction, and the NFET 200N includes a $2^{nd}$ hybrid channel structure 220B and $2^{nd}$ source/drain regions 240B formed at two opposite ends of the $2^{nd}$ hybrid channel structure 220B in the D1 direction. The PFET 200P and the NFET 200N may be formed on a substrate 205 side by side to form a CMOS transistor with an STI structure 215 therebetween as shown in FIG. 2B.

Referring to FIG. 2B, each of the $1^{st}$ and $2^{nd}$ hybrid channel structures 220A and 220B of the PFET 200A and the NFET 200N may take a form of a combination of a plurality of nanosheet layers and a fin structure. Specifically, the PFET 200P may include the $1^{st}$ hybrid channel structure 220A which is a combination of a plurality of $1^{st}$ nanosheet layers 221A and a $1^{st}$ fin structure 222A, and the NFET 200N may include the $2^{nd}$ hybrid channel structure 220B which is a combination of a plurality of $2^{nd}$ nanosheet layers 221B and a $2^{nd}$ fin structure 222B. Here, the $1^{st}$ and $2^{nd}$ nanosheet layers 221A and 221B may be formed in parallel with an upper surface of a substrate 205, and the $1^{st}$ and $2^{nd}$ fin structures 222A and 222B may be formed to be perpendicular to the upper surface of the substrate 205. Further, the $1^{st}$ fin structure 222A may vertically connect the $1^{st}$ nanosheet layers 221A, and the $2^{nd}$ fin structure 222B may vertically connect the $2^{nd}$ nanosheet layers 221B, as shown in FIG. 2B, according to an embodiment.

Hereafter, it is understood that each of the $1^{st}$ nanosheet layers 221A and the $1^{st}$ fin structure 222A may function as a channel structure of the PFET 200A, and each of the $2^{nd}$ nanosheet layers 221B and the $2^{nd}$ fin structure 222B may function as a channel structure of the NFET 200N FIGS. 2B and 2C show that each of the $1^{st}$ and $2^{nd}$ hybrid channel structures 220A and 220B of the PFET 200P and the NFET 200N is formed of two nanosheet layers. However, more or less than two nanosheet layers may form each of the $1^{st}$ and $2^{nd}$ hybrid channel structures 220A and 220B, according to an embodiments.

Thus, the PFET 200P may be formed to have the $1^{st}$ hybrid channel structure 220A including the $1^{st}$ nanosheet layers 221A and the $1^{st}$ fin structure 222A connecting the horizontal $1^{st}$ nanosheet layers 221A in the D3 direction, and the NFET 200N may be formed to have the $2^{nd}$ hybrid channel structure 220B including the $2^{nd}$ nanosheet layers 221B and the $2^{nd}$ fin structure 222B connecting the horizontal $2^{nd}$ nanosheet layers 221B in the D3 direction.

According to an embodiment, the substrate 205 may be a bulk substrate of a semiconductor material, for example, silicon (Si), or a silicon-on-insulator (SOI) substrate, and the $1^{st}$ and $2^{nd}$ nanosheet layers 221A and 221B may have been epitaxially grown from the substrate 205. Thus, the $1^{st}$ and $2^{nd}$ nanosheet layers 221A and 221B may also be formed of Si. Further, referring to FIG. 2B, the $1^{st}$ and $2^{nd}$ fin structures 222A and 222B may have been epitaxially grown from the lowermost $1^{st}$ and $2^{nd}$ nanosheet layers 221AL and 221BL among the $1^{st}$ and $2^{nd}$ nanosheet layers 221A and 221B in the D3 direction, respectively, and thus, may also be formed of Si, according to an embodiment. For this epitaxial growth of the $1^{st}$ and $2^{nd}$ fin structures 222A and 222B from the lowermost $1^{st}$ and $2^{nd}$ nanosheet layers 221AL and 221BL, the lowermost $1^{st}$ and $2^{nd}$ nanosheet layers 221AL and 221BL may be formed to be thicker than uppermost $1^{st}$ and $2^{nd}$ nanosheet layers 221AU and 221BU in the D3 direction, according to an embodiment.

FIG. 2B shows that the $1^{st}$ fin structure 222A may vertically connect a mid-portion M1 of the lowermost $1^{st}$ nanosheet layer 221AL between two opposite ends thereof in the D2 direction to a mid-portion M2 of the uppermost $1^{st}$ nanosheet layer 221AU between two opposite ends thereof in the D2 direction. According to an embodiment, the $1^{st}$ fin structure 222A may have been epitaxially grown from the mid-portion M1 of the lowermost $1^{st}$ nanosheet layer 221AL in an upward direction to be connected to the mid-portion M2 of the uppermost $1^{st}$ nanosheet layer 221AU. The $1^{st}$ fin structure 222A may also be extended upward from the mid-portion M2 of the uppermost $1^{st}$ nanosheet layer 221AU in the D3 direction, according to an embodiment.

Similarly, the $2^{nd}$ fin structure 222B vertically may vertically connect a mid-portion M3 of the lowermost $2^{nd}$ nanosheet layer 221BL between two opposite ends thereof in the D2 direction to a mid-portion M4 of the uppermost $2^{nd}$ nanosheet layer 221BU between two opposite ends thereof in the D2 direction. The $2^{nd}$ fin structure 223A may also have been epitaxially grown from the portion M3 of the lowermost $2^{nd}$ nanosheet layer 221BL in an upward direction to be connected to the mid-portion M4 of the uppermost $2^{nd}$ nanosheet layer 221BU. The $2^{nd}$ fin structure 222B may also be extended upward from the mid-portion M4 of the uppermost $2^{nd}$ nanosheet layer 221BU in the D3 direction, according to an embodiment.

FIG. 2B further shows that the gate structure 230 surrounds all sides of the rectangular-shaped $1^{st}$ and $2^{nd}$ hybrid channel structures 220A and 220B of the PFET 200P and the NFET 200N, according to an embodiment. Although not shown, the gate structure 230 may include a plurality of layers such as an interfacial layer, a gate dielectric layer, a work-function metal layer, and an electrode plug around all sides of the $1^{st}$ and $2^{nd}$ hybrid channel structures 220A and 220B. The interfacial layer may be formed of silicon oxide (SiO), silicon dioxide ($SiO_2$), and/or silicon oxynitride (SiON), not being limited thereto, and the gate dielectric layer may be formed of one or more of high-κ materials such as hafnium (Hf), aluminum (Al), zirconium (Zr), lanthanum (La), magnesium (Mg), barium (Ba), titanium (Ti), and lead (Pb), not being limited thereto, having a dielectric constant greater than 7. The work-function metal layer may be formed of titanium (Ti), tantalum (Ta) or their compound, not being limited thereto, and the electrode plug may be formed of copper (Cu), aluminum (Al), tungsten (W), molybdenum (Mo), ruthenium (Ru) or their compound, not being limited thereto. The work-function metal layer formed on the $1^{st}$ hybrid channel structure 220A may differ from the work-function metal layer formed on the $2^{nd}$ hybrid channel structure 220B in terms of the material or material combination included therein to respectively form the PFET 200P and the NFET 200N.

Referring to FIGS. 2B and 2C, STI structures 215 may be formed in the substrate 205 to isolate the PFET 200P and the NFET 200N from each other and from neighboring transistors (not shown). Here, it is understood that one or more PFETs or NFETs may be formed next to the PFET 200P and NFET 200N in the D1, D2 and/or D3 directions to form the semiconductor device 200, according to an embodiments. The STI structures 215 may include SiO or $SiO_2$, not being limited thereto. An isolation layer 210 formed of, for example, silicon nitride (SiN), may be disposed between the $1^{st}$ and $2^{nd}$ hybrid channel structures 220A and 220B and the substrate 205 to isolate the gate structure 230 surrounding the $1^{st}$ and the $2^{nd}$ hybrid channel structures 220A and 220B from the substrate 205.

Referring to FIGS. 2A and 2C, the $1^{st}$ source/drain regions 240A may be epitaxially grown at the two opposite ends of the $1^{st}$ hybrid channel structure 220A in the D1 direction, and thus, two opposite ends of each of the $1^{st}$ nanosheet layers 221A and two opposite ends of the $1^{st}$ fin structure 222A may be all connected to the $1^{st}$ source/drain regions 240A in the D1 direction. Likewise, as the $2^{nd}$ source/drain regions 240B may be epitaxially grown at the two opposite ends of the $2^{nd}$ hybrid channel structure 22BA in the D1 direction, two opposite ends of each of the $2^{nd}$ nanosheet layers 221B and two opposite ends of the $2^{nd}$ fin structure 222B may be all connected to the $2^{nd}$ source/drain regions 240B.

As the $1^{st}$ and $2^{nd}$ source/drain regions 240A and 240B are epitaxially grown from the $1^{st}$ and $2^{nd}$ hybrid channel structures 220A and 220B, respectively, the $1^{st}$ and $2^{nd}$ source/drain regions 240A and 240B may also be formed of Si. In addition, the $1^{st}$ source/drain regions 240A may be doped with p-type dopants (e.g., boron or gallium) to form the PFET 200P, and the $2^{nd}$ source/drain regions 240B may be doped with n-type dopants (e.g., phosphorus or arsenic) to form the NFET 200N.

With the $1^{st}$ and $2^{nd}$ hybrid channel structures 220A and 220B including the $1^{st}$ and $2^{nd}$ fin structures 222A and 222B combined with the $1^{st}$ and $2^{nd}$ nanosheet layers 221A and 221B, respectively, the PFET 200A and the NFET 200N according to the present embodiment may each achieve an increased effective channel width ($W_{eff}$) to enhance the performance of each transistor within the same semiconductor footprint.

Further, this hybrid channel structure for the PFET 200A and the NFET 200N may provide the advantages of a FinFET as well as a nanosheet transistor. For example, as noted earlier, the relatively large vertical surface of the $1^{st}$ and $2^{nd}$ fin structures 222A and 222B may be used to provide a channel for an enhanced carrier mobility between the $1^{st}$ source/drain regions 240A and between the $2^{nd}$ source/drain regions 240B, respectively. Specifically, as the $1^{st}$ and $2^{nd}$ fin structures provide a (110) crystal direction perpendicular to the substrate 205, the hole (PFET carrier) mobility may be greatly increased compared to the electron (NFET carrier) mobility. Thus, when a hybrid channel structure like the $1^{st}$ and $2^{nd}$ hybrid channel structures 220A is employed to form a filed-effect transistor, a PFET may have a better performance enhancement than an NFET.

In the above embodiment, as described above referring to FIG. 2B, the $1^{st}$ fin structure 222A may connect the mid-portion M1 of the lowermost $1^{st}$ nanosheet layer 221AL between two opposite ends thereof in the D2 direction to the mid-portion M2 of the uppermost $1^{st}$ nanosheet layer 221AU between two opposite ends thereof in the D2 direction to form the hybrid channel structure 220A, and the $2^{nd}$ fin structure 222B may be similarly structured to form the hybrid channel structure 220B. However, the inventive concept is not limited to the above embodiments.

Figure 3A:
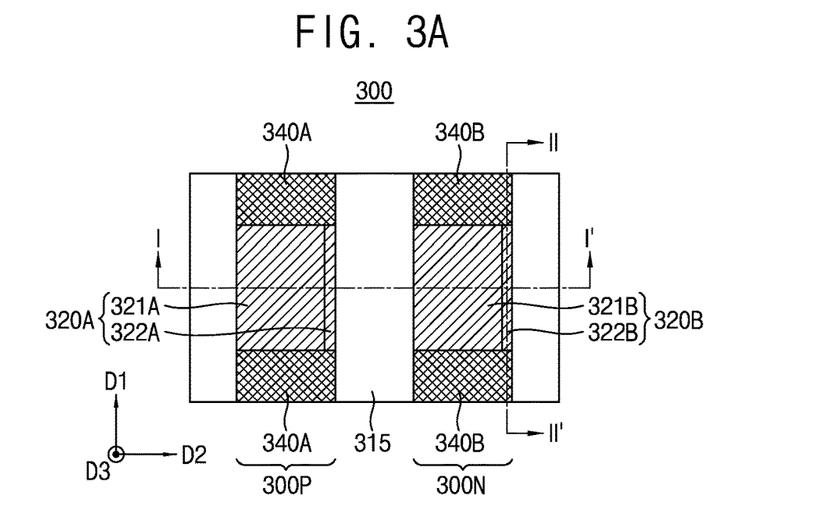
FIG. 3A illustrates a top plan view of another semiconductor device formed of two hybrid transistors.
Figure 3B:
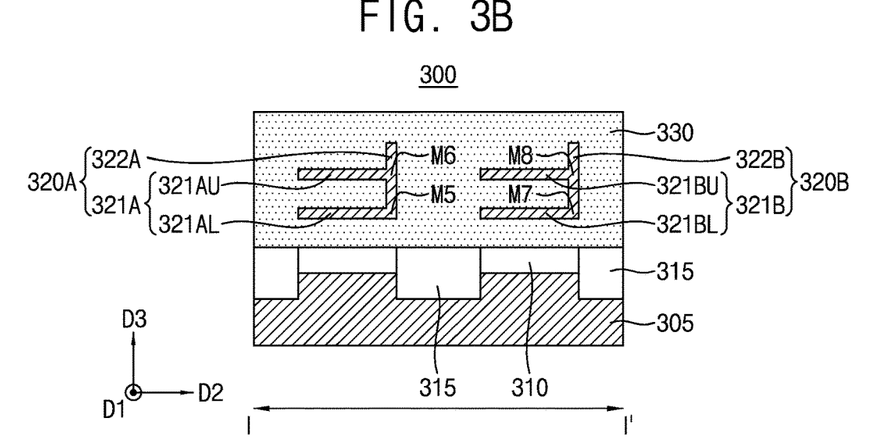
FIGS. 3B and 3C illustrate cross-sectional views of the semiconductor device of FIG. 3A taken along lines I-I' and II-II' shown in FIG. 3A, respectively, according to an embodiments.
Figure 3C:
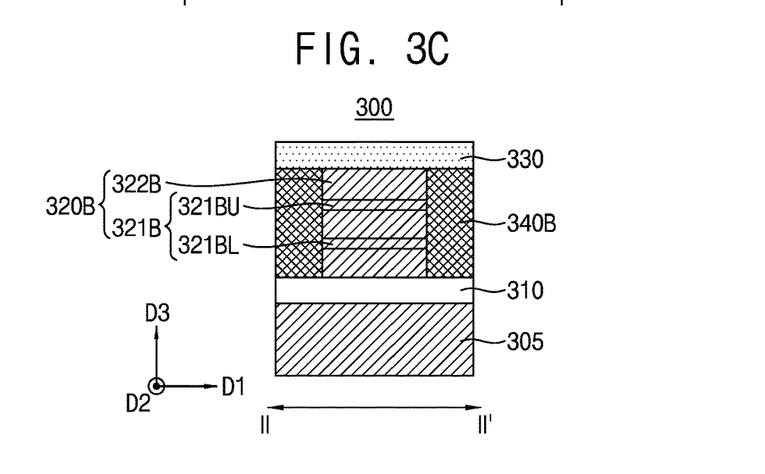

FIG. 3A illustrates a top plan view of another semiconductor device formed of two hybrid transistors, and FIGS. 3B and 3C illustrate cross-sectional views of the semiconductor device of FIG. 3A taken along lines I-I' and II-II' shown in FIG. 3A, respectively, according to an embodiments.

In FIGS. 3A-3C, a semiconductor device 300 according to the present embodiments includes a PFET 300P and an NFET 300N to form a CMOS transistor.

Similar to FIGS. 1A and 2A, FIG. 3A shows the top plan view of the semiconductor device 300 without a gate structure 330 (FIGS. 3B and 3C) so that the other structures of the PFET 300P and the NFET 300N surrounded by the gate structure 330 can be better seen therein. Thus, FIG. 3A shows that the PFET 300P includes a $1^{st}$ hybrid channel structure 320A and $1^{st}$ source/drain regions 340A formed at two opposite ends of the $1^{st}$ hybrid channel structure 320A in the D1 direction, and the NFET 300N includes a $2^{nd}$ hybrid channel structure 320B and $2^{nd}$ source/drain regions 340B formed at two opposite ends of the $2^{nd}$ hybrid channel structure 320B in the D1 direction. The PFET 300P and the NFET 300N may be formed on a substrate 305 side by side to form a CMOS transistor with an STI structure 315 therebetween.

The PFET 300P and the NFET 300N of the present embodiment include the same or similar semiconductor elements included in the PFET 200P and the NFET 200N of the previous embodiment, respectively, and thus, duplicate descriptions thereof are omitted herein to avoid redundancy, and only different aspects of the present embodiment are described below.

Referring to FIGS. 3A-3C, the $1^{st}$ and $2^{nd}$ hybrid channel structures 320A and 320B may be formed on the substrate 305 with an isolation layer 310 therebetween isolating the gate structure 330 surrounding the $1^{st}$ and the $2^{nd}$ hybrid channel structures 320A and 320B from the substrate 305. Here, although each of the $1^{st}$ and $2^{nd}$ hybrid channel structure 320A and 320B is formed of a plurality of nanosheet layers and a fin structure connecting the nanosheet layers like each of the $1^{st}$ and $2^{nd}$ hybrid channel structures 220A and 220B in FIGS. 2A-2C, a position where the fin structure and the nanosheet layers are connected is different in the present embodiment. Thus, the PFET 300P and the NFET 300N may include a differently-shaped hybrid channel structure compared to the PFET 200P and the NFET 200N in FIGS. 2A-2C.

The $1^{st}$ hybrid channel structure 320A may include a plurality of $1^{st}$ nanosheet layers 321A and a $1^{st}$ fin structure 322A vertically connecting an end-portion M5 of a lowermost nanosheet layer 321AL, among the $1^{st}$ nanosheet layers 321A, in the $2^{nd}$ direction to an end-portion M6 of an uppermost $1^{st}$ nanosheet layer 321AU among the $1^{st}$ nanosheet layers 321A in the $2^{nd}$ direction. According to an embodiment, the $1^{st}$ fin structure 322A may have been epitaxially grown from the end-portion M5 of the lowermost $1^{st}$ nanosheet layer 321AL in an upward direction to be connected to the end-portion M6 of the uppermost $1^{st}$ nanosheet layer 321AU. The $1^{st}$ fin structure 322A may also be extended upward from the end-portion M6 of the uppermost $1^{st}$ nanosheet layer 321AU in the D3 direction, according to an embodiment.

Similarly, the $2^{nd}$ hybrid channel structure 320B may include a plurality of $2^{nd}$ nanosheet layers 321B and a $2^{nd}$ fin structure 322B vertically connecting an end-portion M7 of a lowermost $2^{nd}$ nanosheet layer 321BL, among the $2^{nd}$ nanosheet layers 321B, in the $2^{nd}$ direction to an end-portion M8 of an uppermost $2^{nd}$ nanosheet layer 321BU among the $2^{nd}$ nanosheet layers 321B in the $2^{nd}$ direction. According to an embodiment, the $2^{nd}$ fin structure 322B may have been epitaxially grown from the end-portion M7 of the lowermost $2^{nd}$ nanosheet layer 321BL in an upward direction to be connected to the end-portion M8 of the uppermost $2^{nd}$ nanosheet layer 321BU in the D3 direction. The $2^{nd}$ fin structure 322B may also be extended upward from the mid-portion M7 of the uppermost $2^{nd}$ nanosheet layer 321BU in the D3 direction, according to an embodiment.

The $1^{st}$ and $2^{nd}$ hybrid channel structures 320A and 320B may have advantages over the $1^{st}$ and $2^{nd}$ hybrid channel structures 220A and 220B in terms of prevention of current leakage at least.

Referring to FIGS. 2A-2C and 3A-3C, the end-portions M5 to M8 of the $1^{st}$ and $2^{nd}$ hybrid channel structures 320A and 320B provide a smaller number of corner edges than the mid-portions M1 to M4 of the $1^{st}$ and $2^{nd}$ hybrid channel structures 220A and 220B. In other words, there fewer corner-edges generated at the portions where a corresponding fin structure is connected to corresponding nanosheet layers in the $1^{st}$ and $2^{nd}$ hybrid channel structures 320A and 320B than in the $1^{st}$ and $2^{nd}$ hybrid channel structures 220A and 220B. Thus, considering that a current may be leaked more likely in the corner edges, the $1^{st}$ and $2^{nd}$ hybrid channel structures 320A and 320B having less number of corner edges may have a better current performance than the $1^{st}$ and $2^{nd}$ hybrid channel structures 220A and 220B.

FIGS. 4A to 4I illustrate a method of manufacturing a semiconductor device in reference to FIGS. 2A to 2C, according to embodiments. This method is also described in reference to a flowchart shown in FIG. 5.

It is understood here that FIGS. 4A to 4I show a plurality of operations of the method of manufacturing the semiconductor device 200 of FIGS. 2A-2C based on cross-sectional views of the semiconductor device 200 taken along the D2 direction. It is further understood here that a plurality of operations described herebelow may not be limited to the order presented herein.

Figure 4A:
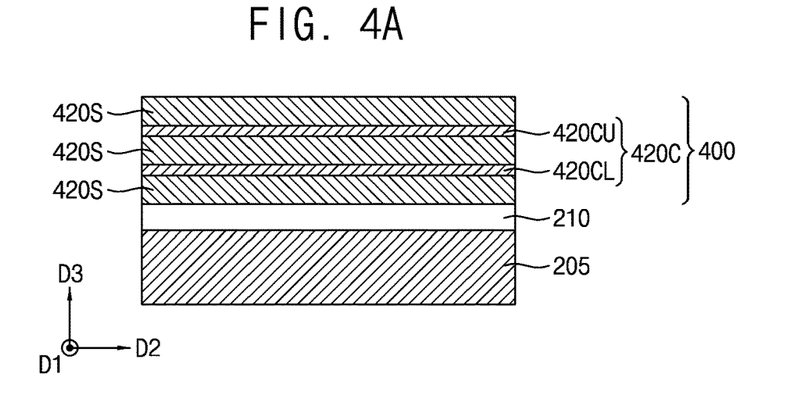
FIGS. 4A to 4I illustrate a method of manufacturing a semiconductor device in reference to FIGS. 2A to 2C, according to embodiments.
Figure 5:
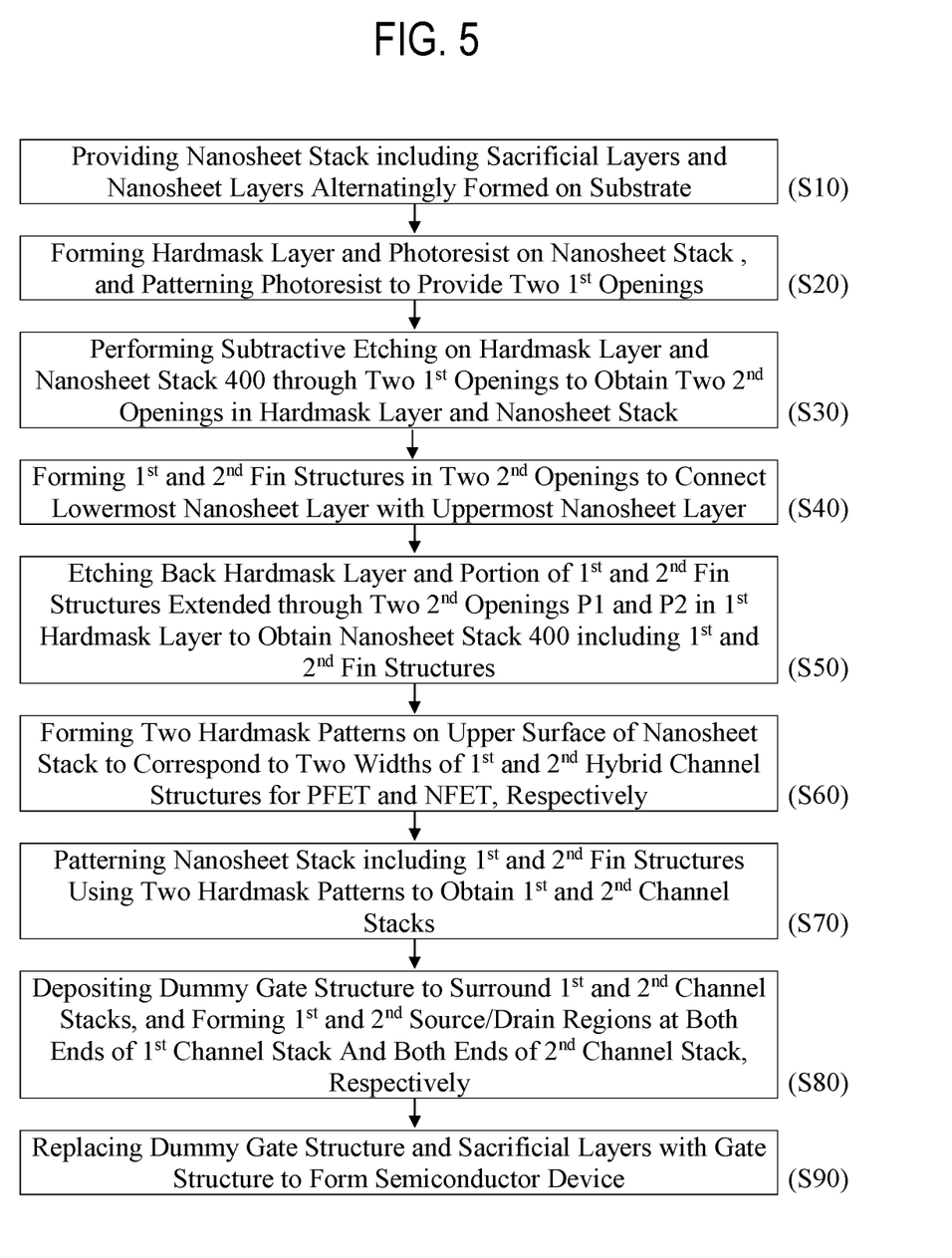
FIG. 5 illustrates a flowchart of the method shown in FIGS. 4A to 4I.

Referring to FIG. 4A, a nanosheet stack 400 including a plurality of sacrificial layers 420S and nanosheet layers 420C alternatingly formed on a substrate 205 may be provided (S10 in FIG. 5).

The nanosheet stack 400 may have been epitaxially grown from the substrate 205. Prior to the growth of the nanosheet stack 400, an isolation layer 210 isolating the nanosheet stack 400 from the substrate 205 may have been epitaxially grown from the substrate 205. The nanosheet layers 420C included in the nanosheet stack 400 may be formed of Si which is the same material forming the substrate 205. The sacrificial layers 420S included in the nanosheet stack 400 may be formed of silicon germanium (SiGe), for example, SiGe 35% which indicates that the SiGe compound includes 35% of Ge and 65% of Si, according to an embodiment. The isolation layer 210 may be formed of SiN or its equivalents.

In FIG. 4A, only two nanosheet layers, that is, lowermost and uppermost nanosheet layer 420CL and 420CU, and three sacrificial layers form the nanosheet stack 400 are shown. However, according to embodiments, more or less than two nanosheet layers and more or less than three sacrificial layers may form the nanosheet stack 400, according to embodiments.

Figure 4B:
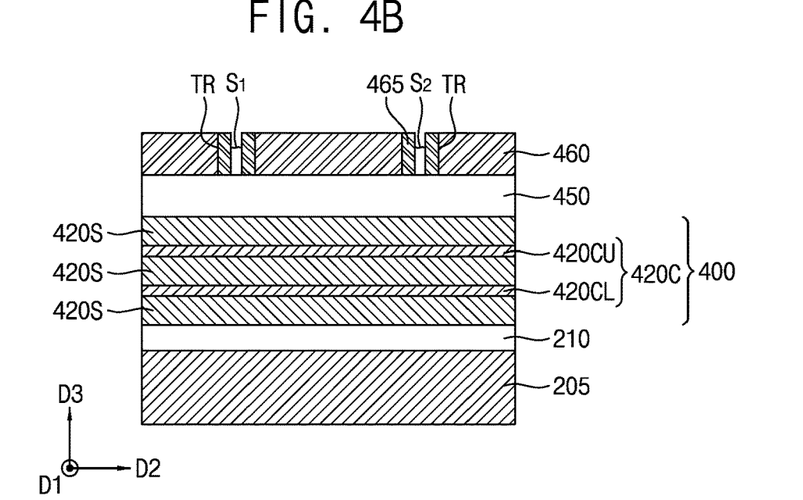

Referring to FIG. 4B, a hardmask layer 450 and a photoresist 460 may be sequentially formed on the nanosheet stack 400, and then, the photoresist 460 may be patterned to provide two $1^{st}$ openings S1 and S2 corresponding to the $1^{st}$ and $2^{nd}$ fin structures 222A and 222B to be formed in a later operation, as shown in FIGS. 2A-2C (S20 in FIG. 5).

The two $1^{st}$ openings S1 and S2 may be formed by patterning the photoresist 460 to obtain two trenches TR, and depositing pattern spacers 465 on side surfaces of the trenches TR so that the two $1^{st}$ openings S1 and S2 may be respectively aligned with two $2^{nd}$ openings P1 and P2 obtained in the nanosheet stack 400 in a later operation. In the two $2^{nd}$ openings P1 and P2, the $1^{st}$ and $2^{nd}$ fin structures 222A and 222B are to be formed in a later operation. Thus, the pattern spacers 465 may be formed such that a width of each of the two $1^{st}$ openings S1 and S2 is the same or substantially the same as a width of each of the $1^{st}$ and $2^{nd}$ fin structures 222A and 222B to be formed.

The formation of the hardmask layer 450 and the photoresist 460 in this operation may be performed by at least one of physical vapor deposition (PVD), chemical vapor deposition (CVD) and plasma-enhanced chemical vapor deposition (PECVD), not being limited thereto. Then, the photoresist 460 may be applied a photolithography process to pattern out the trenches TR in which the pattern spacers 465 are formed.

The hardmask layer 450 may be formed of silicon oxynitride (SiON) or silicon dioxide ($SiO_2$), and the photoresist 460 may include an organic polymer resin containing a photoactive (light sensitive) material, not being limited thereto. The pattern spacers 465 may be formed of a metal, a metal compound or a material providing sufficient etch selectivity with respect to the hardmask layer 450 and the nanosheet stack 400 formed therebelow.

Figure 4C:
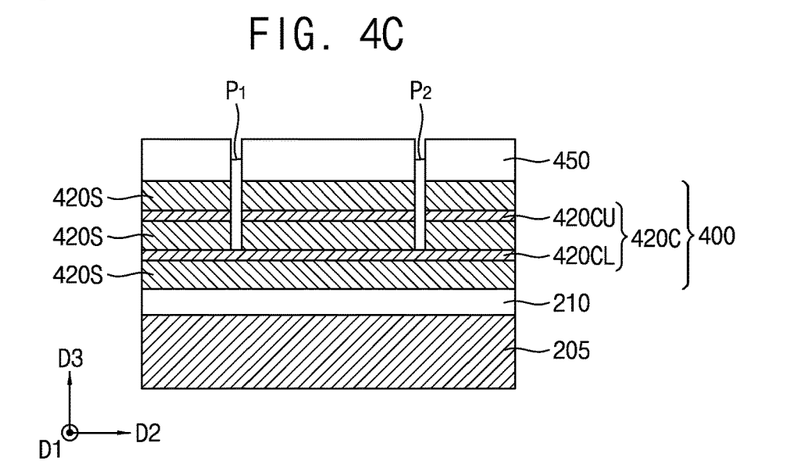

Referring to FIG. 4C, a subtractive etching may be performed on the hardmask layer 450 and the nanosheet stack 400 through the $1^{st}$ openings S1 and S2 to obtain the two $2^{nd}$ openings P1 and P2 in the hardmask layer 450 and the nanosheet stack 400 (S30 in FIG. 5).

The subtractive etching in this operation may be performed, for example, by dry etching and/or reactive ion etching (RIE) to obtain the $2^{nd}$ openings P1 and P2 exposing upward the lowermost nanosheet layer 420CL among the nanosheet layers 420C. After the subtractive etching, the photoresist 460 and the pattern spacers 465 may be removed by an etching or ashing operation.

Figure 4D:
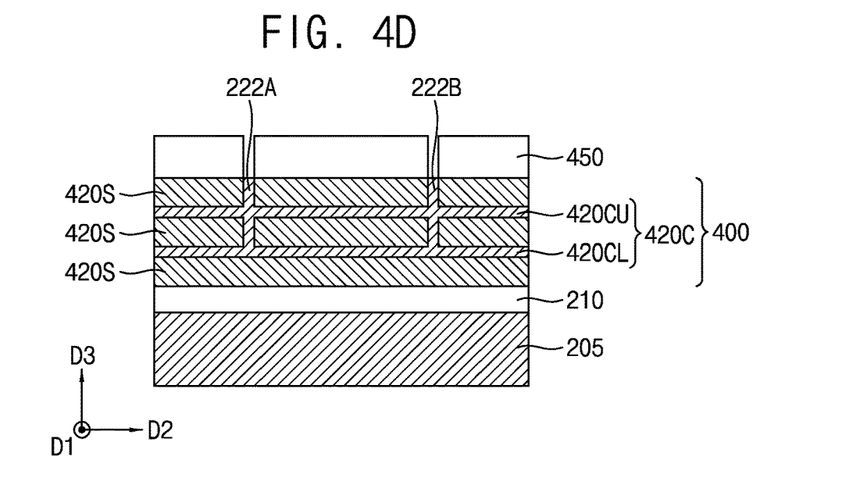

Referring to FIG. 4D, the $1^{st}$ and $2^{nd}$ fin structures 222A and 222B shown in FIGS. 2A-2C may be respectively formed in the two $2^{nd}$ openings P1 and P2 in the nanosheet stack 400 to connect the lowermost nanosheet layer 420CL with an uppermost nanosheet layer 420CU among the nanosheet layers 420C (S40 in FIG. 5).

The $1^{st}$ and $2^{nd}$ fin structures 222A and 222B may be epitaxially grown from the lowermost nanosheet layer 420CL exposed through the two $2^{nd}$ openings P1 and P2 in the previous operation, respectively, to connect the lowermost nanosheet layer 420CL with the uppermost nanosheet layer 420CU and extend to a level at or above an upper surface of an uppermost sacrificial layer 420SU and below a level of an upper surface of the hardmask layer 450. The $1^{st}$ and $2^{nd}$ fin structures 222A and 222B may also be formed of the same material forming the nanosheet layers 420C, for example, Si.

Figure 4E:
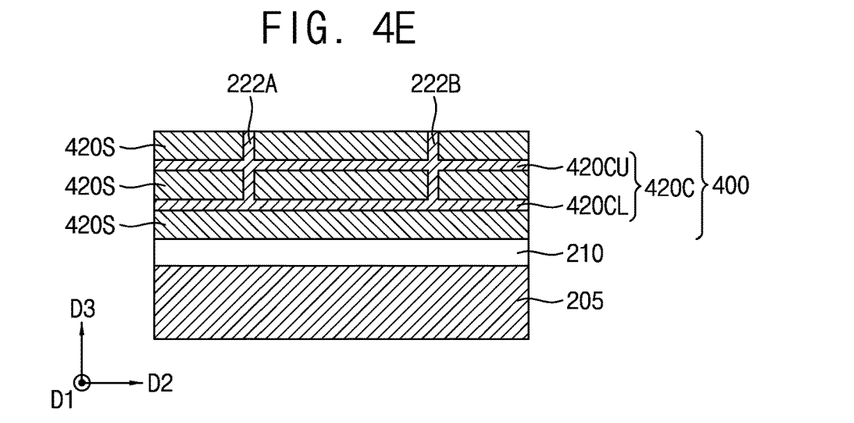

Referring to FIG. 4E, the hardmask layer 450 and a portion of the $1^{st}$ and $2^{nd}$ fin structures 222A and 222B, if any, extended through the two $2^{nd}$ openings P1 and P2 in the hardmask layer 450 may be etched back to obtain the nanosheet stack 400 including the $1^{st}$ and $2^{nd}$ fin structures 222A and 222B (S50 in FIG. 5).

In this etching operation, which may be dry etching, upper surfaces of the $1^{st}$ and $2^{nd}$ fin structures 222A and 222B may become coplanar with the upper surface of the uppermost sacrificial layer 420SU to form a plane upper surface of the nanosheet stack 400.

Figure 4F:
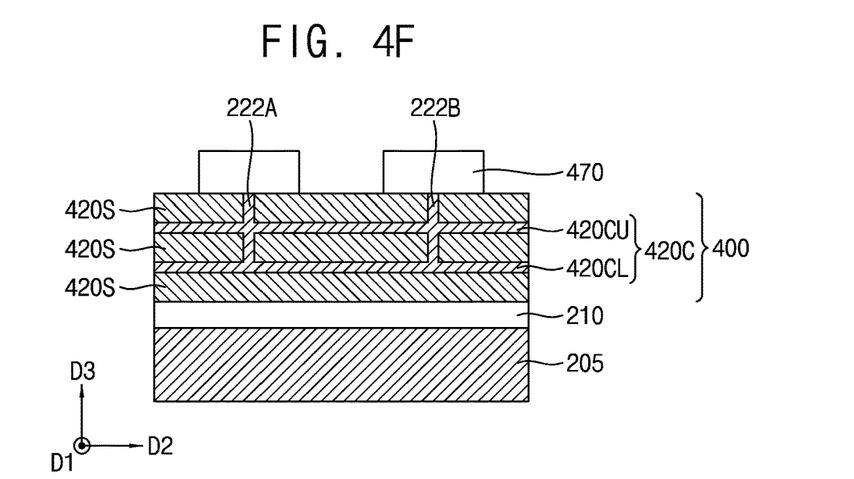

Referring to FIG. 4F, two hardmask patterns 470 may be formed on the upper surface of the nanosheet stack 400 to correspond to two widths of the $1^{st}$ and $2^{nd}$ hybrid channel structures 220A and 220B for the PFET 200P and the NFET 200N, respectively, as shown in FIGS. 2A-2C (S60 in FIG. 5).

In this operation, the two hardmask patterns 470 may be formed to cover the two $2^{nd}$ openings P1 and P2, respectively, on the upper surface of the nanosheet stack 400.

Although not shown, the hardmask patterns 470 may be obtained through another photolithography process using another photoresist and another hardmask layer. The hardmask patterns 470 may be formed of the same material forming the hardmask layer 450, for example, SiON or $SiO_2$.

Figure 4G:
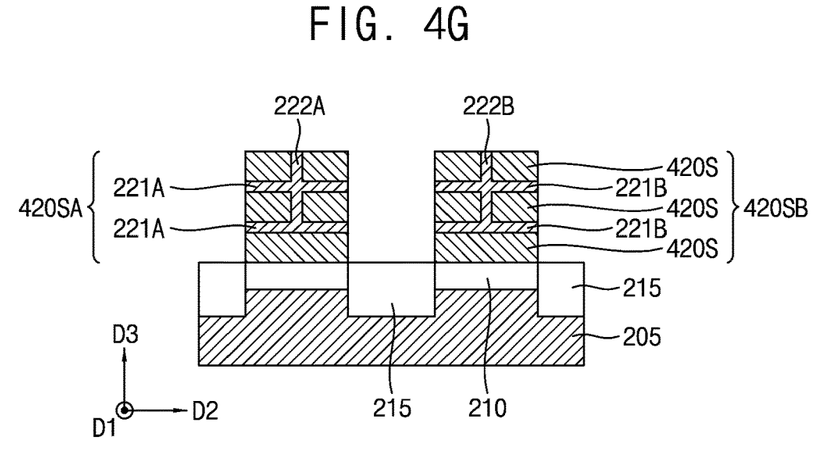

Referring to FIG. 4G, the nanosheet stack 400 including the $1^{st}$ and $2^{nd}$ fin structures 222A and 222B may be patterned using the two hardmask patterns 470 to obtain a $1^{st}$ channel stack 420SA and an $2^{nd}$ channel stack 420SB (S70 in FIG. 5).

The patterning operation may generate the $1^{st}$ channel stack 420SA, which is a $1^{st}$ section of the nanosheet stack in the D2 direction below one of the two hardmask patterns 470, and the $2^{nd}$ channel stack 420SB, which is a $2^{nd}$ section of the nanosheet stack in the D2 direction below the other of the two hardmask patterns 470. Thus, the $1^{st}$ channel stack 420SA may include the $1^{st}$ nanosheet layers 221A and the $1^{st}$ fin structure 222A connecting the $1^{st}$ nanosheet layers 221A and extended in an upward direction to an upper surface of the $1^{st}$ channel stack 420A. Further, the $2^{nd}$ channel stack 420SB may include the $2^{nd}$ nanosheet layers 221B and the $2^{nd}$ fin structure 222B connecting the $2^{nd}$ nanosheet layers 221Bn and extended in an upward direction to an upper surface of the $2^{nd}$ channel stack 420B.

The patterning operation may be performed on the nanosheet stack 400 by dry etching and/or reactive ion etching (RIE) based on the hardmask patterns 470 such that the $1^{st}$ channel stack 420SA and the $2^{nd}$ channel stack 420SB are obtained on the substrate 205. Further, through this patterning, the substrate 205 at portions which are not masked by the hardmask patterns 470 may be etched down to provide shallow trenches in the substrate 205, and the STI structures 215 may be formed therein. The STI structures 215 may include SiN or its equivalents to isolate the $1^{st}$ channel stack 420SA and the $2^{nd}$ channel stack 420SB from each other or other neighboring transistors in the semiconductor device 200 to be formed by the method of the present embodiment.

After the 1$^{st}$ channel stack 420SA and the 2$^{nd}$ channel stack 420SB are obtained, the hardmask patterns 470 formed thereon may be removed by another etching or ashing operation.

Figure 4H:
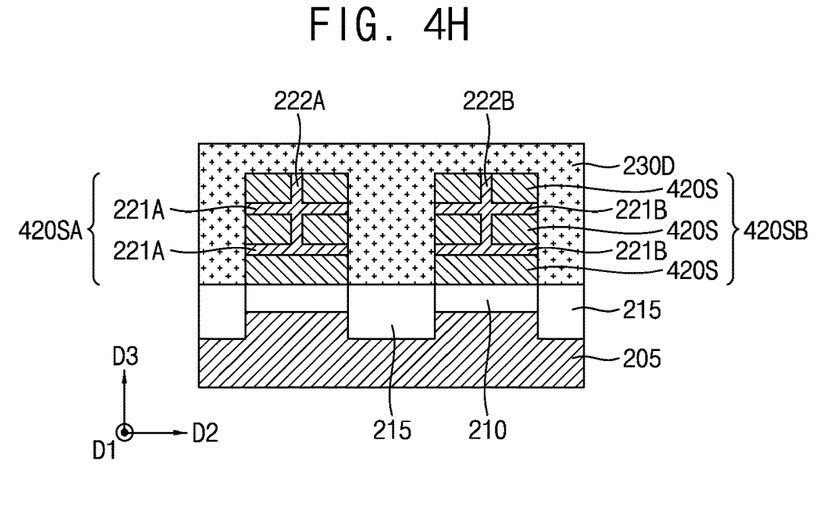

Referring to FIG. 4H, a dummy gate structure 230D may be deposited to surround the 1$^{st}$ and 2$^{nd}$ channel stacks 420SA and 420SB, and the 1$^{st}$ and 2$^{nd}$ source/drain regions 240A and 240B (not shown) are formed at both ends of the 1$^{st}$ channel stack 420SA and both ends of the 2$^{nd}$ channel stack 420SB in the D1 direction, respectively (S80 in FIG. 5).

The dummy gate structure 230D may be formed using techniques such as photolithography, chemical vapor deposition (CVD), flowable CVD (FCVD), dry etching, planarization, etc., not being limited thereto. The dummy gate structures 230D may be formed of polycrystalline silicon (poly-Si) or amorphous silicon (a-Si), not being limited thereto.

The 1$^{st}$ source/drain regions 240A may be doped with p-type impurities (e.g., boron or gallium) for the PFET 200P, and the 2$^{nd}$ source/drain regions 240B may be doped with n-type impurities (e.g., phosphorus or arsenic) for the NFET 200N, according to an embodiment.

Figure 4I:
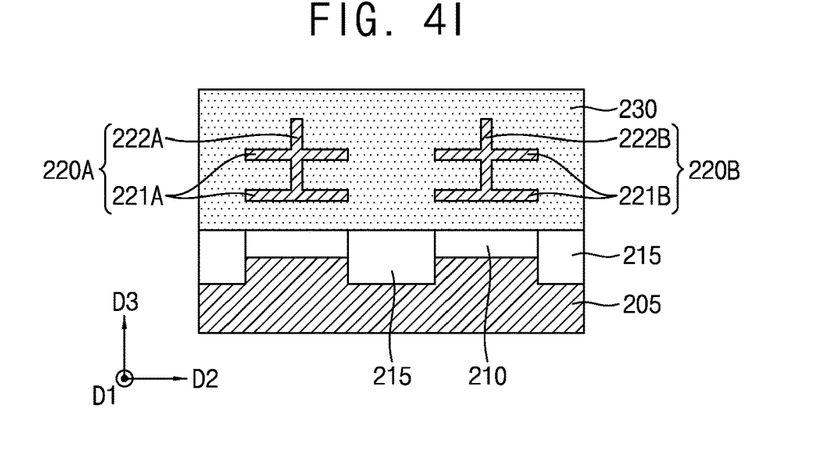

Referring to FIG. 4I, which corresponds to FIG. 2B, the dummy gate structure 230D and the sacrificial layers 420S may be removed to obtain the 1$^{st}$ and 2$^{nd}$ hybrid channel structures 220A and 220B, and the gate structure 230 may fill voids generated vy the removal of the dummy gate structure 230D and the sacrificial layers 420S to form the semiconductor device 200 (S90 in FIG. 5).

Here, the removal of the dummy gate structure 230D and the sacrificial layers 420S may be performed by dry etching, wet etching, reactive ion etching (RIE) and/or a chemical oxide removal (COR) process, not being limited thereto. The gate structure 230 may also be formed using CVD, FCVD and ALD, not being limited thereto.

The gate structure 230 may include a plurality of layers such as an interfacial layer, a gate dielectric layer, a work-function metal layer, and an electrode plug around all sides of the 1$^{st}$ and 2$^{nd}$ hybrid channel structures 220A and 220B. The interfacial layer may be formed of SiO, SiO$_2$ and/or SiON, not being limited thereto, and the gate dielectric layer may be formed of one or more of high-κ materials. The work-function metal layer may be formed of Ti, Ta, or their compound, and the electrode plug may be formed of Cu, Al, W, Mo, Ru or their compound.

The above operations described referring to FIGS. 4A-4I may be used to form the semiconductor device 200 shown in FIGS. 2A-2C. However, the semiconductor device 300 shown in FIGS. 3A-3C may also be obtained by the above operation except that the positions of the two hardmask patterns 470 on the nanosheet stack 400 are changed in operation S60 (FIGS. 4F and 5) such that respective two end portions of the two hardmask patterns 470 in the D2 direction are aligned with and cover the two 2$^{nd}$ openings P1 and P2 therebelow.

Further, although the method described above is for manufacturing a CMOS transistor including two hybrid channel structures, a single hybrid transistor may also be obtained through a gate cutting operation after operation S90 shown in FIG. 4I.

The above operations of manufacturing the semiconductor devices 200 and 300 including the 1$^{st}$ and 2$^{nd}$ hybrid channel structures 220A, 320A, 220B and 320B may not particularly disrupt an existing manufacturing process for a semiconductor device which includes only regular nanosheet channel structures once the vertical connection of the 1$^{st}$ and 2$^{nd}$ fin structures 222A, 322A, 222B and 322B with the nanosheet layers 420C are performed through the operations shown in FIGS. 4B-4E. This aspect may ensure sufficient compatibility with the existing manufacturing process that has already been set in the field.

Thus far, the embodiments of the inventive concept have described a semiconductor device including a CMOS transistor formed of two hybrid channel structures formed side by side on a substrate for a PFET and an NFET, respectively. Each of these hybrid channel structures is formed of a plurality of nanosheet layers and a connecting fin structure as described above. However, application of this hybrid channel structure may not be limited to the above embodiments.

According to embodiments, two or more hybrid channel structures may be formed on two or more stacks, respectively, to obtain a multi-stack CMOS transistor where an upper stack includes an hybrid channel structure forming one of a PFET and an NFET, and a lower stack includes an hybrid channel structure forming the other of the PFET and the NFET. When a static random access memory (SRAM) such as a six-transistor (6T) SRAM is formed using multi-stack CMOS transistors, a PFET may be formed on an upper stack while an NFET may be formed on the lower stack considering that the 6T SRAM includes two n-type pass-gate transistors, two n-type pull-down transistors, and two p-type pull-up transistors, according to an embodiment.

However, two hybrid channel structures formed side by side or respectively formed on upper and lower stacks may form the same-type transistor, that is, a PFET or an NFET, according to embodiments.

Further, according to an embodiments, when two or more hybrid channel structures form one or more CMOS transistors or two or more non-CMOS transistors on a single- or multi-stack, the hybrid channel structures may not take the same shape. For example, at least one of the hybrid channel structures may take a shape of the hybrid channel structures 220A and 220B shown in FIGS. 2A-2C, and another at least one of the hybrid channel structures may take a shape of the hybrid channel structures 320A and 320B shown in FIGS. 3A-3C.

Moreover, when forming one or more CMOS transistors or two or more non-CMOS transistors on a single- or multi-stack, at least one of the channel structures may be a regular nanosheet channel structure without a fin structure like the above-described 1$^{st}$ and 2$^{nd}$ fin structures 222A and 222B, and another at least one of the channel structures may be a hybrid channel structure.

In addition, when two or more channel structures are formed side by side or at different stacks, these channel structures, whether they are a hybrid channel structure or not, do not necessarily have to have the same dimensions, such as a channel width, length or height. These dimensions may be adjusted differently considering at least the required channel capacity.

Figure 6:
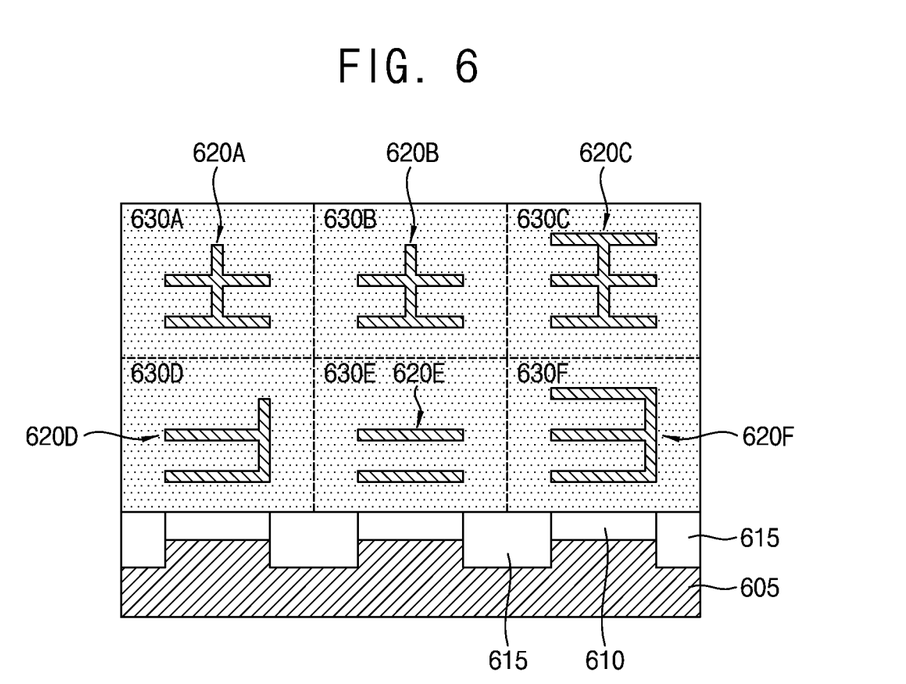
FIG. 6 illustrates an example of a multi-stack semiconductor device in which a plurality of channel structures having different shapes are formed side by side and at different stacks, according to an embodiment.

FIG. 6 illustrates an example of a multi-stack semiconductor device in which a plurality of channel structures having different shapes are formed side by side and at different stacks, according to an embodiment.

A semiconductor device 600 shown in FIG. 6 is formed of five different hybrid channel structures 620A, 620B, 620C, 620D and 620F, and one regular nanosheet channel structure 620E on a substrate 605 with an isolation structure 610 and STI structures 615 thereon. The hybrid channel structures 620A and 620B may take a shape of the hybrid channel structures 220A and 220B shown in FIGS. 2A-2C, but may have different channel widths in the D2 direction. The hybrid channel structure 620D may take a shape of the hybrid channel structures 320A and 320B, and the hybrid channel structures 620C and 620F may have shapes different from the hybrid channel structures 220A, 220B, 320A and 320B.

FIG. 6 shows that each of the channel structures 620A-620F is surrounded by gate structures 630A-630F, respectively. According to embodiments, these gate structures 630A-630F may include at least one p-type gate structure and at least one n-type gate structure, or may be formed of only one of the two-types of gate structures.

The materials forming the channel structures 620A-620F, the gate structures 630A-630F, the isolation structure 610 and the STI structures 615 may be the same or substantially the same as those forming the corresponding structures described in the previous embodiments. Further, the method of manufacturing the semiconductor device 600 may also be the same or similar to that for the semiconductor device 200. Thus, descriptions thereof are omitted herein.

In the meantime, the above embodiments of a hybrid channel structure shown in FIGS. 2A-2C, 3A-3C and FIG. 6 are all formed of a plurality nanosheet layers and a fin structure intersecting the nanosheet layers in the D3 direction. However, according to embodiments, a hybrid channel structure may also be formed of a plurality fin structures extended in the D3 direction and at least one nanosheet layer intersecting the fin structures in a cross-sectional view of the D2 direction.

Further, while all of the hybrid channel structures shown in FIGS. 2A-2C, 3A-3C and FIG. 6 have an open shape in a cross-sectional view of the D2 direction, at least one of these hybrid channel structures may have a closed shape as described below.

Figure 7:
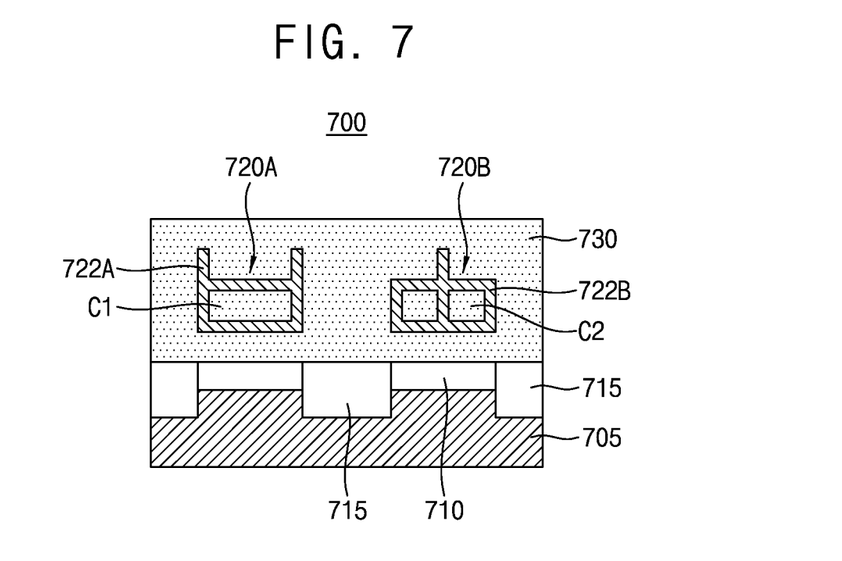
FIG. 7 illustrates a semiconductor device including hybrid channel structures having a closed shape, according to embodiments.

FIG. 7 illustrates a semiconductor device including hybrid channel structures having a closed shape, according to embodiments.

Referring to FIG. 7, a semiconductor device 700 is formed of two hybrid channel structures 720A and 720B on a substrate 705 with an isolation structure 710 and STI structures 715 thereon. The two hybrid channel structures 720A and 720B are also surrounded by a gate structure 730.

The hybrid channel structures 720A and 720B are characterized in that these channel structures have closed areas C1 and C2, according to an embodiment. Since the closed areas C1 and C2 are formed by adding one or more additional fin structures 721A and/or 721B to one or more horizontal nanosheet layers, effective channel widths ($W_{eff}$) may be further increased for the semiconductor device 700. However, it may be difficult to fill in a dummy gate structure in the closed areas C1 and C, and then, replace the dummy gate structure filled in the closed areas C1 and C2 with a replacement metal gate structure, that is, the gate structure 730 during a manufacturing process of the semiconductor device 700. Thus, subject to a design choice, a hybrid channel structure having a closed shape like the hybrid channel structures 720A and 720B may be optionally adopted in manufacturing a semiconductor device.

Figure 8:
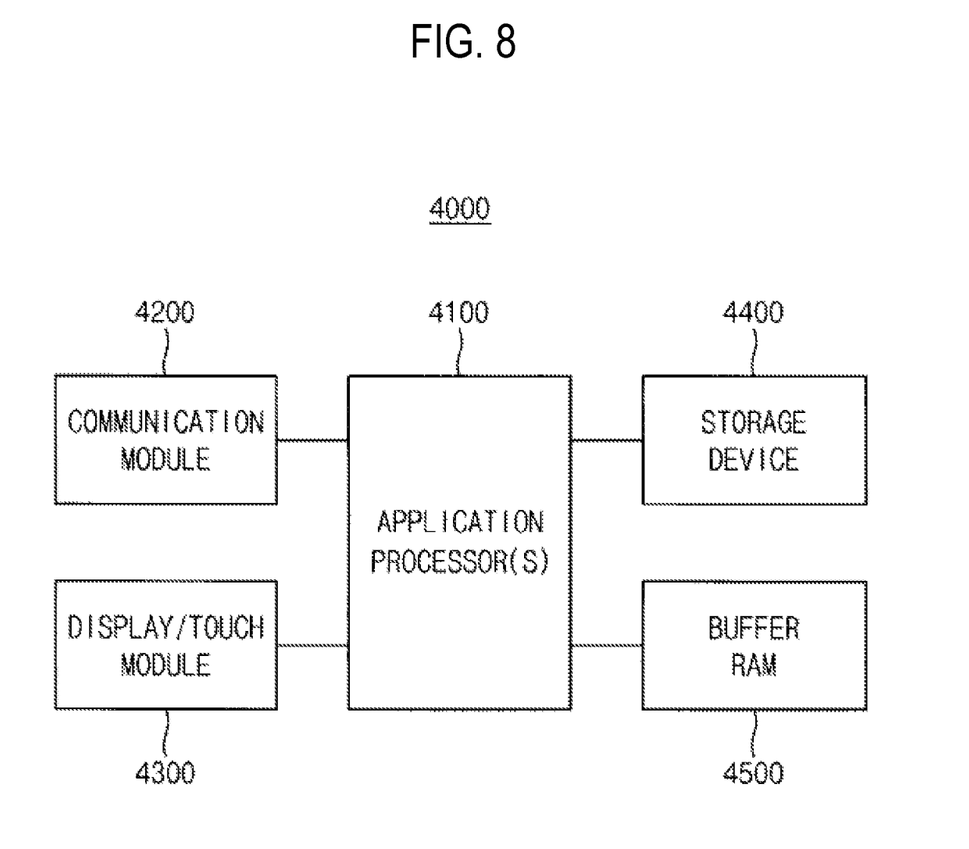
FIG. 8 is a schematic block diagram illustrating an electronic device including a semiconductor device, according to an example embodiment.

FIG. 8 is a schematic block diagram illustrating an electronic device including a semiconductor device, according to an example embodiment.

Referring to FIG. 8, an electronic device 4000 may include at least one application processor 4100, a communication module 4200, a display/touch module 4300, a storage device 4400, and a buffer random access memory (RAM) 4500. The electronic device 4000 may be a mobile device such as a smartphone or a tablet computer, not being limited thereto, according to embodiments.

The application processor 4100 may control operations of the mobile device 4000. The communication module 4200 is implemented to perform wireless or wire communications with an external device. The display/touch module 4300 is implemented to display data processed by the application processor 4100 and/or to receive data through a touch panel. The storage device 4400 is implemented to store user data. The storage device 4400 may be an embedded multimedia card (eMMC), a solid state drive (SSD), a universal flash storage (UFS) device, etc. The storage device 4400 may perform caching of the mapping data and the user data as described above.

The buffer RAM 4500 may temporarily store data used for processing operations of the mobile device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

At least one component in the mobile device 4000 may include at least one of the semiconductor device including one or more hybrid channel structures described in the embodiments described thus far.

The foregoing is illustrative of exemplary embodiments and is not to be construed as limiting the inventive concept. Although a few exemplary embodiments have been described, those skilled in the art will readily appreciate that many modifications are possible in the above embodiments without materially departing from the inventive concept.

What is claimed is:

1. A semiconductor device comprising:
a substrate;
at least one hybrid channel structure formed on the substrate, and comprising:
at least one $1^{st}$ channel structure extended in $1^{st}$ and $2^{nd}$ directions parallel with a top surface of the substrate; and
a $2^{nd}$ channel structure connected to and intersecting the at least one $1^{st}$ channel structure in a $3^{rd}$ direction which is perpendicular to the $1^{st}$ and $2^{nd}$ directions;
a gate structure surrounding the at least one hybrid channel structure; and
source/drain regions respectively formed at two opposite ends of the at least one hybrid channel structure in the $1^{st}$ direction,
wherein a bottom surface of the $2^{nd}$ channel structure is above a bottom surface of the at least one $1^{st}$ channel structure in the $3^{rd}$ direction, and
wherein the $2^{nd}$ channel structure is connected to the at least one $1^{st}$ channel structure at an end portion thereof in the $2^{nd}$ direction perpendicular to the $1^{st}$ direction.

2. The semiconductor device of claim 1, wherein the at least one $1^{st}$ channel structure comprises a plurality of $1^{st}$ channel structures stacked in parallel with each other without directly contacting the substrate.

3. The semiconductor device of claim 2, wherein the $2^{nd}$ channel structure connects at least two of the $1^{st}$ channel structures in the $3^{rd}$ direction.

4. The semiconductor device of claim 3, wherein the $2^{nd}$ channel structure connects, in the $3^{rd}$ direction, at least two of the $1^{st}$ channel structures at end portions thereof in the $2^{nd}$ direction.

5. The semiconductor device of claim 3, wherein two opposite ends of each of the at least two $1^{st}$ channel structures in the $1^{st}$ direction are connected to the source/drain regions, respectively, and
wherein two opposite ends of the $2^{nd}$ channel structure are also connected to the source/drain regions, respectively.

6. The semiconductor device of claim 5, wherein the at least one hybrid channel structure comprises a plurality hybrid channel structures formed side by side on the substrate.

7. The semiconductor device of claim 5, wherein the at least one hybrid channel structure comprises a plurality hybrid channel structures formed at upper and lower stacks, respectively, on the substrate.

8. The semiconductor device of claim 1, wherein the source/drain regions connected to one of the at least one hybrid channel structure are doped with p-type impurities.

9. A semiconductor device comprising:
a substrate;
a plurality of $1^{st}$ nanosheet layers formed above the substrate, and extended in $1^{st}$ and $2^{nd}$ directions perpendicular to each other and parallel with a top surface of the substrate;
a $1^{st}$ fin structure formed above the substrate, extended in the $1^{st}$ direction, and connecting at least two of the $1^{st}$ nanosheet layers in a $3^{rd}$ direction perpendicular to the $1^{st}$ or $2^{nd}$ direction, a width of the $1^{st}$ fin structure being smaller than a width of each of the $1^{st}$ nanosheet layers in the $2^{nd}$ direction;
a gate structure surrounding the $1^{st}$ nanosheet layers and the $1^{st}$ fin structure; and
$1^{st}$ source/drain regions respectively formed at two opposite ends of each of the $1^{st}$ nanosheet layers in the $1^{st}$ direction,
wherein two opposite ends of the $1^{st}$ fin structure in the $1^{st}$ direction are respectively connected to the $1^{st}$ source/drain regions,
wherein a bottom surface of the $1^{st}$ fin structure is above a bottom surface of the lowermost nanosheet layer of the at least two of the $1^{st}$ nanosheet layers in the $3^{rd}$ direction, and
wherein the $1^{st}$ fin structure connects, in the $3^{rd}$ direction, the at least two of the $1^{st}$ nanosheet layers at end portions thereof in the $2^{nd}$ direction.

10. The semiconductor device of claim 9, wherein the $1^{st}$ source/drain regions are doped with p-type impurities.

11. The semiconductor device of claim 9, wherein bottom surfaces of the $1^{st}$ nanosheet layers and the $1^{st}$ fin structure are surrounded by the gate structure.

12. The semiconductor device of claim 9, further comprising:
a plurality of $2^{nd}$ nanosheet layers formed above the $1^{st}$ nanosheet layers and the $1^{st}$ fin structure, and extended in the $1^{st}$ and $2^{nd}$ directions in parallel;
a $2^{nd}$ fin structure formed above the $1^{st}$ nanosheet layers and the $1^{st}$ fin structure, extended in the $1^{st}$ direction, and connecting at least two of the $2^{nd}$ nanosheet layers in the $3^{rd}$ direction, a width of the $2^{nd}$ fin structure being smaller than a width of each of the $2^{nd}$ nanosheet layers in the $2^{nd}$ direction; and
$2^{nd}$ source/drain regions respectively formed at two opposite ends of each of the $2^{nd}$ nanosheet layers in the $1^{st}$ direction,
wherein the $2^{nd}$ nanosheet layers and the $2^{nd}$ fin structure are surrounded by the gate structure, and
wherein two opposite ends of the $2^{nd}$ fin structure in the $1^{st}$ direction are respectively connected to the $2^{nd}$ source/drain regions.

13. The semiconductor device of claim 12, wherein the $1^{st}$ source/drain regions are doped with n-type impurities, and the $2^{nd}$ source/drain regions are doped with p-type impurities.

14. A method of manufacturing a semiconductor device, the method comprising:
providing a nanosheet stack comprising a plurality nanosheet layers stacked on a substrate in a vertical direction;
forming at least one opening exposing upward a top surface of a lowermost nanosheet layer among the nanosheet layers in the vertical direction;
forming at least one fin structure, in the at least one opening, which connects the lowermost nanosheet layer and an uppermost nanosheet layer among the nanosheet layers;
patterning at least one channel stack comprising a section of the nanosheet layers in a channel width direction and the at least one fin structure;
forming source/drain regions on two opposite ends of the at least one channel stack in a channel length direction; and
forming a gate structure on the at least one channel stack.

15. The method of claim 14, wherein the patterning the at least one channel stack comprises:
forming at least one hardmask pattern on the nanosheet stack to cover the at least one opening in which the at least one fin structure is formed; and
etching the nanosheet stack using the at least one hardmask pattern to obtain the at least one channel stack.

16. The method of claim 15, wherein the at least one hardmask pattern is formed on the nanosheet stack such that each of the at least one opening is positioned between two opposite end portions of each of the at least one hardmask patterns in the channel width direction.

17. The method of claim 14, wherein the forming the at least one fin structure in the at least one opening comprises:
epitaxially growing the at least one fin structure based on the lowermost nanosheet layer to be connected to the uppermost nanosheet layer, and extended upward to a level above an upper surface of the upper nanosheet layer.

* * * * *